United States Patent
Robinson et al.

[11] Patent Number: 5,942,131
[45] Date of Patent: *Aug. 24, 1999

[54] TREATMENT OF A SURFACE HAVING AN EXPOSE SILICON/SILICA INTERFACE

[75] Inventors: Karl M. Robinson; Michael A. Walker, both of Boise, Id.

[73] Assignee: Micron Technology, Inc., Boise, Id.

[ * ] Notice: This patent is subject to a terminal disclaimer.

[21] Appl. No.: 08/877,613

[22] Filed: Jun. 17, 1997

Related U.S. Application Data

[63] Continuation of application No. 08/604,427, Feb. 21, 1996, Pat. No. 5,645,737.

[51] Int. Cl.⁶ .................................. B08B 3/04; C23G 1/00
[52] U.S. Cl. ............................ 216/99; 438/690; 438/691; 438/692; 438/745; 438/756
[58] Field of Search ..................... 438/756, 690, 438/691, 692, 745; 216/99

[56] References Cited

U.S. PATENT DOCUMENTS

| | | | |
|---|---|---|---|
| 5,389,164 | 2/1995 | Rostoker et al. | 156/636 |
| 5,389,194 | 2/1995 | Rostoker et al. | 156/636 |
| 5,478,436 | 12/1995 | Winebarger et al. | 156/636.1 |
| 5,498,293 | 3/1996 | Ilardi et al. | 134/3 |
| 5,645,737 | 7/1997 | Robinson et al. | 216/99 |

*Primary Examiner*—Robert Kunemund
*Attorney, Agent, or Firm*—Workman Nudegger & Seeley

[57] ABSTRACT

A surface having an exposed silicon/silica interface is cleaned by ah HF dip, followed immediately by a rinse in citric acid, followed by a rinse in deionized water. Low pH of the citric acid significantly prevents the formation of a charge differential between the silica and silicon portions of the surface, which charge differential would otherwise cause any silica particles present to remain on the silicon portion of the surface. Surfactant properties of the citric acid help remove any silica particles from the surface. The deionized water rinse then removes the citric acid from the surfaces, leaving a very clean, low particulate surface on both the silica and silicon portions thereof, with little or no etching of the silicon portion.

30 Claims, 2 Drawing Sheets

TREATMENT OF A SURFACE HAVING AN EXPOSE SILICON/SILICA INTERFACE

This is a continuation of U.S. patent application Ser. No. 08/604,427, filed on Feb. 21, 1996, titled "WET CLEAN OF A SURFACE HAVING AN EXPOSED SILICON/SILICA INTERFACE" now U.S. Pat. No. 5,645,737.

BACKGROUND OF THE INVENTION

1. The Field of the Invention

The present invention relates to the manufacture of semiconductor devices. More particularly, the present invention is directed to methods for performing a wet clean of a surface having an exposed silicon/silica interface, which wet clean is useful in the manufacture of semiconductor devices. The methods are particularly useful for a post chemical mechanical polishing clean of a surface having an exposed silicon/silica interface.

2. The Relevant Technology

Chemical mechanical polishing is finding increasing application in the manufacture of semiconductor devices to planarize surfaces in preparation for high resolution photolithography and for other purposes. Chemical mechanical polishing involves polishing an uppermost film on the surface of a semiconductor wafer by use of a polishing pad and a polishing slurry. The slurry contains polishing particles. Pad types and slurry compositions vary depending on the material being polished and other factors.

Chemical mechanical polishing is particularly useful where feature sizes of less than 0.5 micron must be defined over a topography already existing on the wafer surface. In such circumstances, a reflowed silica glass layer is insufficiently planar, but with chemical mechanical polishing, sufficient planarity may be achieved to facilitate high resolution photolithography. Chemical mechanical polishing may also be employed to completely remove portions of a layer being polished, so that underlying material is exposed. In either case, a clean step is required after the chemical mechanical polishing to clean polishing slurry from the wafer surface.

Where silica (silicon dioxide) or silicon is the layer being polished, the polishing slurry typically contains silica particles having an average size of about 30 nanometers (nm). The silica particles that remain on a silica surface after polishing are typically removed by a clean process including an HF (hydrofluoric acid solution) dip followed by a deionized water rinse. Silica particles and other contamination remaining on a silicon surface after polishing are typically cleaned in an ammonium hydroxide solution or the like.

Where a silica layer is polished until some silicon is exposed, or where a silicon layer is polished until some silica is exposed, the above typical clean processes can result in problems. While the typical clean process for silica is effective to remove silica particles from a silica surface, a silicon surface is not adequately cleaned. Silica particles tend to collect on the silicon surface and, once the clean process is complete, tend to permanently adhere there, regardless of further cleans. The typical clean processes for silicon are likewise ineffective to remove silica particles from a silica surface. Further, an ammonium hydroxide clean, which etches silicon, can be unacceptable where particularly fine or small silicon structure must be preserved. Accordingly, there exists a need for a clean process which can remove silica particles from both silica and silicon surfaces, and particularly without etching the silicon surface.

SUMMARY AND OBJECTS OF THE INVENTION

An object of the present invention is to provide a method for cleaning a surface having an exposed silicon/silica interface.

Another object of the present invention is to provide a method for removing silica particles from a surface having an exposed silicon/silica interface.

Yet another object of the present invention is to provide a method for cleaning a surface having an exposed silicon/silica interface, which surface was produced by chemical mechanical polishing.

Still another object of the present invention is to provide a reliable, easily performed method of removing silica particles from a surface having an exposed silicon/silica interface.

Still another object of the present invention is to provide a method for cleaning a surface having an exposed silicon/silica interface without significant etching of the exposed silicon.

In accordance with the present invention, a surface having an exposed silicon/silica interface is cleaned by an HF dip, followed immediately by a rinse in an organic carboxylic acid surfactant. A preferred organic carboxylic acid surfactant is citric acid. The organic carboxylic acid surfactant can be pentadecanoic acid or other similar long chain acids. Following the rinse in the organic carboxylic acid surfactant is a rinse in deionized water. Low pH of the organic carboxylic acid surfactant significantly prevents the formation of a charge differential between the silica and silicon portions of the surface, which charge differential would otherwise cause any silica particles present to remain on the silicon portions of the surface. The surfactant properties of the selected organic carboxylic acid helps to remove any silica particles from the surface. The deionized water rinse then removes the organic carboxylic acid surfactant from the surface, leaving a very clean, low particulate surface on both the silica and silicon portions thereof, with little or no etching of the silicon portion.

These and other objects and features of the present invention will become more fully apparent from the following description and appended claims, or may be learned by the practice of the invention as set forth hereinafter.

BRIEF DESCRIPTION OF THE DRAWINGS

In order that the manner in which the above-recited and other advantages and objects of the invention are obtained may be more fully explained, a more particular description of the invention briefly described above will be rendered by reference to specific embodiments and applications thereof which are illustrated in the appended drawings. Understanding that these drawings depict only typical embodiments and applications of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

As an overview, the present invention provides a method for cleaning surfaces having silicon and silica exposed, and particularly for removing from such surfaces silica particles left after chemical mechanical polishing. The exposed silicon may be of any type, including for example doped and undoped single crystal silicon, epitaxial silicon, polysilicon, and amorphous silicon. The silica may also be of any type such as doped or undoped, grown or deposited, including any type of silica glass. The inventive method described in detail below successfully removes silica particle contamination from both silica and silicon surfaces without substantially etching the silicon surface.

Figure 1:
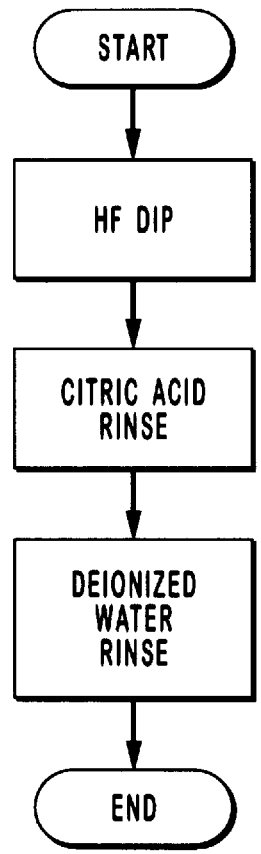
FIG. 1 is a flow diagram of a method of the present invention.

According to the present invention, a surface having an exposed silicon/silica interface is cleaned by performing the process illustrated in the flow diagram of FIG. 1. The surface is typically a surface of a semiconductor wafer which has been chemically mechanically polished, leaving silica particle contamination.

As a first step, the surface is contacted with hydrofluoric acid. This is preferably achieved by dipping the wafer in hydrofluoric acid. Next, the surface is contacted with an organic carboxylic acid surfactant, which will preferably be citric acid. The organic carboxylic acid surfactant can be pentadecanoic acid or other similar long chain acids. The contact with the surface is preferably achieved by dipping the wafer in citric acid or flowing citric acid, rinsing the wafer in citric acid, spraying the surface of the wafer with citric acid, or a similar technique. Last, the surface is rinsed with deionized water. This may be achieved in any of many ways known to those of skill in the art.

The first step of the process flow shown in FIG. 1, the HF dip, is preferably performed in hydrofluoric acid having preferably a concentration within the range of about 4:1 to about 250:1, and most preferably a concentration of about 100:1. Other known ways of contacting the surface with HF may optionally be substituted for the HF dip.

The second step of the process flow shown in FIG. 1, the citric acid rinse, should be performed soon, and preferably immediately, after the HF dip, and without any intervening rinse in deionized water. If a deionized water rinse were to follow the HF dip, silica particles would collect on the silicon portion of the surface. This is a result of a buildup of charge on the silica particles and the silica portions of the surface. At higher pH values (such as a pH of about 7 as for deionized water) the silica particles and the silica portion of the surface become negatively charged, repelling each other, while the silicon portions of the surface remain neutral or are only slightly negatively charged. The mutual repulsion of the silica particles and the silica portions of the surface tends to concentrate the silica particles on the silicon portions of the surface, and to prevent the silica particles from being removed by translational motion along the surface.

The second step of the process flow shown in FIG. 1, the citric acid rinse, is performed in citric acid of sufficient strength so as to have a pH value preferably within the range of about 2 to about 4, and most preferably about pH 2.2. At these pH levels, no significant charge is built up on the silica particles and silica portions of the surface. The immediate transfer of the surface from contact with HF to contact with citric acid, without an intervening deionized water rinse, keeps the pH low and prevents the silica particles from becoming charged. The surfactant properties of the citric acid assist in washing away the particles, while the low pH prevents the mutual repulsion of the silica particles and the silica portions of the surface, allowing the silicon portions of the surface to be cleaned of silica particles.

In the third step of the process flow shown in FIG. 1, the deionized water rinse, the citric acid is gradually removed from the surface, and the pH level at the surface increases gradually, eventually passing a point at which the silica particles and the silica portions of the surface become charged. By that point, however, the silica particles have been substantially removed from the surface, either by the citric acid rinse or by the initial stages of the deionized water rinse.

Figure 2:
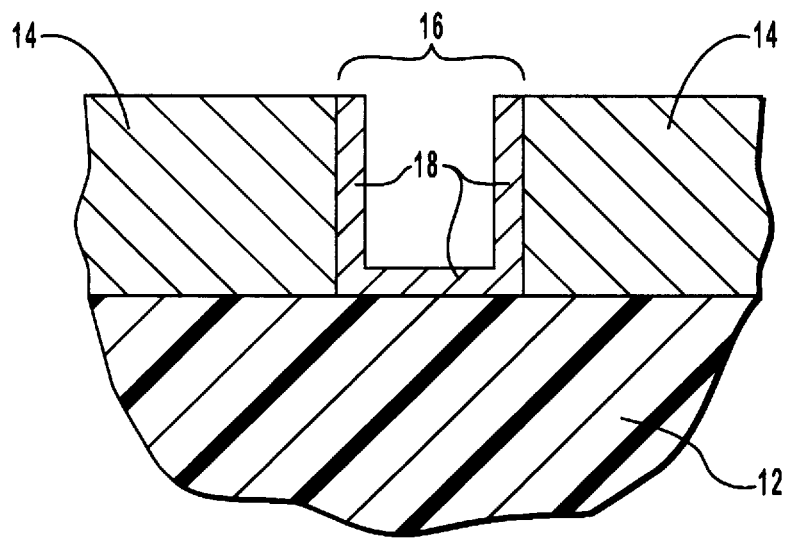
FIG. 2 is a partial cross section of a partially formed semiconductor device on which a method of the present invention may be beneficially performed.
Figure 3:
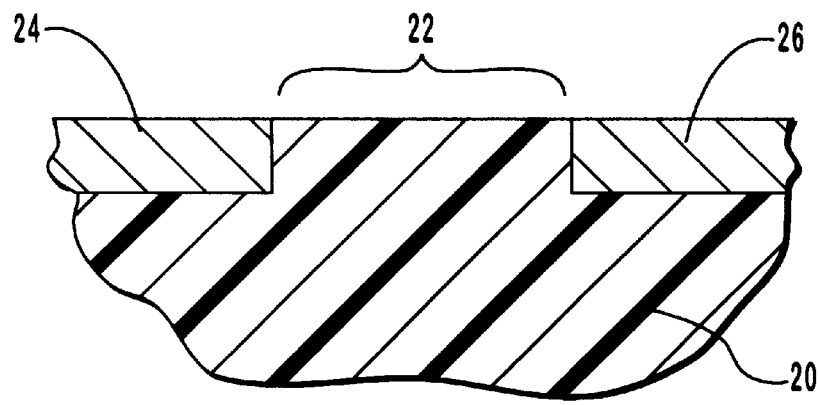
FIG. 3 is another partial cross section of a partially formed semiconductor device on which a method of the present invention may be beneficially performed.
Figure 4:
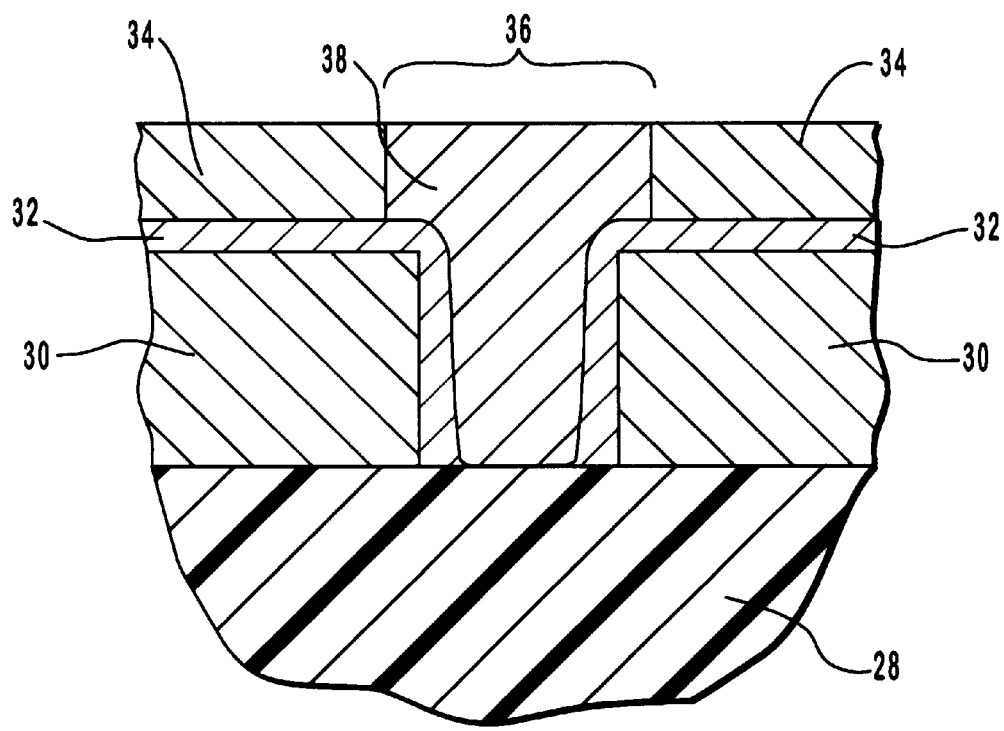
FIG. 4 is yet another partial cross section of a partially formed semiconductor device on which a method of the present invention may be beneficially performed.

Presently preferred applications for the method steps seen in FIG. 1 are illustrated in FIGS. 2–4.

FIG. 2 is a partial cross section of a partially formed semiconductor device showing a substrate 12 upon which a layer of silica 14 such as BPSG has been formed. Layer of silica 14 has been etched away at a certain location, leaving a space 16 therein. A thin layer of silicon has been deposited conformably over substrate 12 and layer of silica 14, then removed by chemical mechanical polishing until only a layer of silicon 18 at space 16 remains. Layer of silicon 18 will function in the completed semiconductor device as the lower capacitor plate of a container capacitor.

The method steps of the present invention are particularly useful to clean a wafer having the structure shown in FIG. 2. The chemical mechanical polishing used to form the structure shown in FIG. 2 leaves silica particles that must be removed. Because both layer of silica 14 and layer of silicon 18 are exposed, a standard HF dip followed by a deionized water rinse causes silica particles to collect on silicon layer 18, particularly on the uppermost upward facing surfaces thereof, near the interface of layer of silica 14 and layer of silicon 18. Because capacitance of a capacitor depends on surface area and hence on such fine features as surface roughness, any clean that etches silicon would negatively impact capacitance of a capacitor formed with layer of silicon 14. The method steps of the present invention avoid both problems by providing a cleaning method that removes silica particles from both silica and silicon without etching silicon.

The method steps of the present invention also finds useful application where planarization of active and isolation regions is desired. FIG. 3 shows a silicon substrate 20 having an active region 22 isolated by field oxide regions 24 and 26. The structure shown in FIG. 3 may be formed by etching a silicon substrate to form an island at the location desired for the active region, then masking the island and growing oxide around the island. Alternatively, the island may be left unmasked and oxide may be grown around and over the island. In either case, the grown oxide is then polished by chemical mechanical polishing back to the level of the unoxidized silicon of the island, resulting in the structure of FIG. 3. The method of the present invention may then be applied to clean the surfaces of active region 22 and field oxide regions 24 and 26.

Further beneficial use of the present invention may be found where silicon plugs are isolated and planarized by means of chemical mechanical polishing. FIG. 4 shows a substrate 28 having raised structures 30 such as gate stacks formed thereon. Raised structures 30 are enclosed in a layer of spacer material 32 over which a layer of silica 34 such as BPSG has been conformably deposited. A space 36 has then been etched in layer of silica 34 down to substrate 28 with an etch process selective to spacer material 32. A layer of silicon such as doped polysilicon has then been deposited conformably over substrate 28, spacer material 32, and layer of silica 34. The layer of silicon is then polished by chemical mechanical polishing back to the level of layer of silica 34, resulting in a silicon plug 38. The method of the present may then be applied to clean the exposed surfaces of layer of silica 34 and silicon plug 38.

The method of the present invention may further be beneficially applied in virtually any process requiring a clean of a surface having an exposed silicon/silica interface, particularly where silica particles or any other particles with similar electrical characteristics are present.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. A method for treating a surface on a semiconductor substrate, said surface having thereon an exposed silicon/silica interface, said method comprising:
   contacting said exposed silicon/silica interface of said surface with a hydrofluoric acid solution; and
   contacting said exposed silicon/silica interface of said surface with citric acid.

2. The method as defined in claim 1, further comprising after contacting said exposed silicon/silica interface of said surface with citric acid:
   rinsing said exposed silicon/silica interface of said surface in deionized water.

3. The method as defined in claim 1 wherein said hydrofluoric acid solution has a concentration within the range of about 4:1 to about 250:1.

4. The method as defined in claim 3 wherein said silicon of said exposed silicon/silica interface of said surface is substantially composed of a material selected from a group consisting of doped single crystal silicon, undoped single crystal silicon, epitaxial silicon, polysilicon, and amorphous silicon.

5. The method as defined in claim 1, wherein contacting said exposed silicon/silica interface of said surface with said hydrofluoric acid solution comprises dipping said semiconductor substrate in a hydrofluoric acid solution.

6. The method as defined in claim 1, wherein contacting said exposed silicon/silica interface of said surface with citric acid comprises dipping said semiconductor substrate in citric acid.

7. The method as defined in claim 1, wherein contacting said exposed silicon/silica interface of said surface with citric acid comprises spraying said exposed silicon/silica interface of said surface with citric acid.

8. The method as defined in claim 1, further comprising, prior to contacting said exposed silicon/silica interface of said surface with said hydrofluoric acid solution, performing a polishing step to expose the silicon/silica interface of the surface situated on the semiconductor substrate.

9. The method as defined in claim 1, wherein said exposed silicon/silica interface of said surface comprises at least one of:
   a silica surface and an exposed edge of a silicon capacitor plate;
   a silicon surface and field oxide surface; and
   a silica surface and the surface of a silicon contact plug.

10. The method as defined in claim 8, wherein the polishing step is a chemical mechanical polishing step.

11. The method as defined in claim 2, wherein said silicon of said exposed silicon/silica interface of said surface is substantially unremoved by said hydrofluoric acid solution and by said citric acid, and wherein, after said rinse, said silicon of said exposed silicon/silica interface of said surface has substantially no silica particles thereon.

12. A method for treating a semiconductor substrate, said method comprising:
   polishing said semiconductor substrate to expose a silicon/silica interface on a surface situated on the semiconductor substrate;
   contacting said exposed silicon/silica interface of said surface with a hydrofluoric acid solution; and
   contacting said exposed silicon/silica interface of said surface with citric acid.

13. The method as defined in claim 12, further comprising, after contacting said exposed silicon/silica interface of said surface with citric acid:
   rinsing said exposed silicon/silica interface of said surface in deionized water, whereby silica particles are removed from said surface situated on said semiconductor substrate.

14. The method as defined in claim 12, wherein said hydrofluoric acid solution has a concentration within the range of about 4:1 to 250:1.

15. The method as defined in claim 14, wherein said polishing the semiconductor substrate to expose a silicon/silica interface on a surface situated on the semiconductor substrate is a chemical mechanical polishing step.

16. The method as defined in claim 12, wherein contacting said exposed silicon/silica interface of said surface with said hydrofluoric acid solution comprises dipping said semiconductor substrate in a hydrofluoric acid solution.

17. The method as defined in claim 12, wherein contacting said exposed silicon/silica interface with citric acid comprises at least one of spraying and dipping said semiconductor substrate in citric acid.

18. The method as defined in claim 12, wherein said silicon of said exposed silicon/silica interface of said surface is substantially composed of a material selected from a group consisting of doped single crystal silicon, undoped single crystal silicon, epitaxial silicon, polysilicon, and amorphous silicon.

19. A method for cleaning a surface situated on a semiconductor substrate, said method comprising:
   chemical mechanical polishing a semiconductor substrate to expose a silicon/silica interface on a surface situated on the semiconductor substrate;
   dipping said semiconductor substrate in a hydrofluoric acid solution having a concentration within the range of about 4:1 to 250:1 so as to contact said exposed silicon/silica interface of said surface with said hydrofluoric acid solution; and
   dipping said semiconductor substrate in a citric acid solution so as to contact said exposed silicon/silica interface of said surface with said citric acid solution.

20. The method as defined in claim 19, further comprising, after contacting said exposed silicon/silica interface of said surface with citric acid:
   rinsing said exposed silicon/silica interface of said surface in deionized water, whereby silica particles are removed from said surface situated on said semiconductor substrate.

21. The method as defined in claim 19, wherein said silicon of said exposed silicon/silica interface of said surface is substantially composed of a material selected from a group consisting of doped single crystal silicon, undoped single crystal silicon, epitaxial silicon, polysilicon, and amorphous silicon.

22. A method for treating a surface on a semiconductor substrate, said surface having thereon an exposed silicon/silica interface, said method comprising:

contacting said exposed silicon/silica interface of said surface with a hydrofluoric acid solution; and contacting said exposed silicon/silica interface of said surface with pentadecanoic acid.

23. The method as defined in claim 22, further comprising, after contacting said exposed silicon/silica interface of said surface with pentadecanoic acid:

rinsing said exposed silicon/silica interface of said surface in deionized water.

24. The method as defined in claim 22, wherein said hydrofluoric acid solution has a concentration within the range of about 4:1 to about 250:1.

25. The method as defined in claim 22, further comprising, prior to contacting said exposed silicon/silica interface of said surface with said hydrofluoric acid solution:

polishing said semiconductor substrate to expose the silicon/silica interface of the surface situated on the semiconductor substrate.

26. The method as defined in claim 22, wherein said exposed silicon/silica interface of said surface comprises at least one of:

a silica surface and an exposed edge of a silicon capacitor plate;

a silicon surface and field oxide surface; and a silica surface and the surface of a silicon contact plug.

27. The method as defined in claim 12, wherein said exposed silicon/silica interface of said surface comprises at least one of:

a silica surface and an exposed edge of a silicon capacitor plate;

a silicon surface and field oxide surface; and a silica surface and the surface of a silicon contact plug.

28. The method as defined in claim 19, wherein said exposed silicon/silica interface of said surface comprises at least one of:

a silica surface and an exposed edge of a silicon capacitor plate;

a silicon surface and field oxide surface; and a silica surface and the surface of a silicon contact plug.

29. A method of treating a semiconductor substrate, said method comprising:

chemical mechanical polishing said semiconductor substrate to expose a silicon/silica interface of a surface situated on the semiconductor substrate, wherein the silicon of said exposed silicon/silica interface of said surface is substantially composed of a material selected from a group consisting of doped single crystal silicon, undoped single crystal silicon, epitaxial silicon, polysilicon, and amorphous silicon, and wherein said exposed silicon/silica interface of said surface comprises at least one of:

a silica surface and an exposed edge of a silicon capacitor plate;

a silicon surface and field oxide surface; and a silica surface and the surface of a silicon contact plug;

contacting said exposed silicon/silica interface of said surface with a hydrofluoric acid solution having a concentration within the range of about 4:1 to about 250:1, wherein said silicon of said exposed silicon/silica interface of said surface is substantially unremoved by said hydrofluoric acid solution;

contacting said exposed silicon/silica interface of said surface with citric acid, wherein said silicon of said exposed silicon/silica interface of said surface is substantially unremoved by said citric acid solution; and rinsing said exposed silicon/silica interface of said surface in deionized water, wherein said silicon of said exposed silicon/silica interface of said surface has substantially no silica particles thereon.

30. A method of treating a semiconductor substrate, said method comprising:

chemical mechanical polishing said semiconductor substrate to expose a silicon/silica interface of a surface situated on the semiconductor substrate, wherein the silicon of said exposed silicon/silica interface of said surface is substantially composed of a material selected from a group consisting of doped single crystal silicon, undoped single crystal silicon, epitaxial silicon, polysilicon, and amorphous silicon, and wherein said exposed silicon/silica interface of said surface comprises at least one of:

a silica surface and an exposed edge of a silicon capacitor plate;

a silicon surface and field oxide surface; and a silica surface and the surface of a silicon contact plug;

contacting said exposed silicon/silica interface of said surface with a hydrofluoric acid solution having a concentration within the range of about 4:1 to about 250:1, wherein said silicon of said exposed silicon/silica interface of said surface is substantially unremoved by said hydrofluoric acid solution;

contacting said exposed silicon/silica interface of said surface with pentadecanoic acid, wherein said silicon of said exposed silicon/silica interface of said surface is substantially unremoved by said pentadecanoic acid solution; and rinsing said exposed silicon/silica interface of said surface in deionized water, wherein said silicon of said exposed silicon/silica interface of said surface has substantially no silica particles thereon.

* * * * *